(12) United States Patent
Zhang

(10) Patent No.: US 11,825,681 B2
(45) Date of Patent: Nov. 21, 2023

(54) DISPLAY PANEL AND DISPLAY DEVICE

(71) Applicant: Yungu (Gu'an) Technology Co., Ltd., Hebei (CN)

(72) Inventor: Xiuyu Zhang, Hebei (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 111 days.

(21) Appl. No.: 17/545,462

(22) Filed: Dec. 8, 2021

(65) Prior Publication Data

US 2022/0102676 A1 Mar. 31, 2022

Related U.S. Application Data

(63) Continuation of application No. PCT/CN2020/122800, filed on Oct. 22, 2020.

(30) Foreign Application Priority Data

Dec. 24, 2019 (CN) .......................... 201911350603.3

(51) Int. Cl.
*H10K 50/842* (2023.01)
*H01L 25/18* (2023.01)
*G06F 3/041* (2006.01)

(52) U.S. Cl.
CPC ....... *H10K 50/8426* (2023.02); *G06F 3/0416* (2013.01); *H01L 25/18* (2013.01); *G06F 2203/04103* (2013.01)

(58) Field of Classification Search
CPC .................. G06F 3/0412; G06F 3/0416; G06F 2203/04103; G09F 9/30; H10K 50/8426; H01L 25/18
See application file for complete search history.

(56) References Cited

U.S. PATENT DOCUMENTS 10,074,701 B2 9/2018 Jeong et al.
2016/0254255 A1* 9/2016 Hori ........................ H01L 23/16
257/685

(Continued)

FOREIGN PATENT DOCUMENTS

CN 106505089 A 3/2017
CN 106708342 A 5/2017

(Continued)

OTHER PUBLICATIONS

PCT International Search Report for International Application No. PCT/CN2020/122800 dated Jan. 21, 2021.

(Continued)

*Primary Examiner* — Ryan A Lubit

(57) ABSTRACT

A display panel includes: a substrate; a display component layer disposed on a side of the substrate; an encapsulation layer disposed on a side of the display component layer away from the substrate; and a touch-control layer disposed on a side of the encapsulation layer away from the display component layer. The display component layer and the touch-control layer are bonded by a bonding structure. A through hole is disposed in the encapsulation layer, and the bonding structure is disposed in the through hole. According to the display panel provided in the embodiments of the present application, a touch-control chip and a display driving chip are integrated into one chip assembly, and a position of the touch-control layer contacted with a display screen body and an encapsulation area of the display screen body are overlapped.

20 Claims, 3 Drawing Sheets

(56) References Cited

U.S. PATENT DOCUMENTS

| | | | |
|---|---|---|---|
| 2017/0243927 A1 | 8/2017 | Jeong et al. | |
| 2018/0203555 A1 | 7/2018 | Miyamoto | |
| 2018/0292903 A1* | 10/2018 | Li | H10K 59/40 |
| 2019/0131353 A1 | 5/2019 | Tang | |
| 2019/0221630 A1* | 7/2019 | Ye | G06F 3/0416 |
| 2019/0294274 A1* | 9/2019 | Cho | G06F 3/0416 |
| 2020/0204756 A1 | 6/2020 | Yantao | |
| 2020/0310580 A1* | 10/2020 | Han | G06F 3/0446 |

FOREIGN PATENT DOCUMENTS

| | | |
|---|---|---|
| CN | 106775062 A | 5/2017 |
| CN | 107180852 A | 9/2017 |
| CN | 107275379 A | 10/2017 |
| CN | 108874203 A | 11/2018 |
| CN | 109493745 A | 3/2019 |
| CN | 109614005 A | 4/2019 |
| CN | 109727539 A | 5/2019 |
| CN | 209199067 U | 8/2019 |
| CN | 110581157 A | 12/2019 |
| CN | 111128022 A | 5/2020 |
| JP | 2007025518 A | 2/2007 |
| JP | 2015056522 A | 3/2015 |
| JP | 2015072662 A | 4/2015 |
| JP | 2015219654 A | 12/2015 |
| JP | 2017142382 A | 8/2017 |
| JP | 2018025757 A | 2/2018 |
| WO | 2015109601 A1 | 7/2015 |

OTHER PUBLICATIONS

PCT Written opinion for International Application No. PCT/CN2020/122800 dated Jan. 21, 2021.

Chinese First Office Action for CN Application No. 201911350603.3 dated Dec. 30, 2020.

European Search Report for EP Application No. 20905236.4, dated Sep. 15, 2022; 9 pages.

Japanese First Office Action (with English translation), dated Feb. 21, 2023, corresponding to Japanese Application No. 2022-511397; 8 total pages.

* cited by examiner

DISPLAY PANEL AND DISPLAY DEVICE

CROSS-REFERENCE TO RELATED APPLICATIONS

The present application is a continuation of International Application No. PCT/CN2020/122800, filed on Oct. 22, 2020, which claims priority to Chinese Patent Application No. 201911350603.3, filed on Dec. 24, 2019. All applications are incorporated herein by reference in their entireties.

TECHNICAL FIELD

Embodiments of the present application relate to the field of display technologies, and in particular to a display panel and a display device.

BACKGROUND

With the development of mobile phones to ultra-thin and large screens, and demands for touch-control screens in tablets and ultra-books, touch-control screen technologies are evolving rapidly. A touch-control screen mainly adopts an external touch-control module. The external touch-touch module increases a thickness of a display screen and a process difficulty of a display screen. A touch-control chip and a display driving chip can be integrated into one chip assembly, in this way, the thickness and the process difficulty of the entire display screen can be reduced, it also brings a problem of a wide frame of the display screen, this cannot adapt to the development of the narrow frame technology and even the full screen technology. Therefore, in the related art, a touch-control display screen cannot achieve small thickness, simple process, narrow frame and even full screen at the same time.

SUMMARY

In view of this, embodiments of the present application provide a display panel and a display device, so that a technical problem that a touch-control display screen in the related art cannot achieve small thickness, simple process, narrow frame and even full screen at the same time is solved.

In order to make objectives, technical means and advantages of the present application clearer, a further detailed description on the present application will be given below in combination with accompanying drawings. Apparently, the described embodiments are merely some but not all of the embodiments of the present application. Based on the embodiments of the present application, all other embodiments obtained by those skilled in the art without creative efforts shall fall within the protection scope of the present application.

According to an aspect of the present application, an embodiment of the present application provides a display panel, including: a substrate; a display component layer disposed on a side of the substrate; an encapsulation layer disposed on a side of the display component layer away from the substrate; and a touch-control layer disposed on a side of the encapsulation layer away from the display component layer. The display component layer and the touch-control layer are bonded by a bonding structure. A through hole is disposed in the encapsulation layer, and the bonding structure is disposed in the through hole.

In an embodiment of the present application, the touch-control layer includes: a first insulating layer disposed on the side of the encapsulation layer away from the display component layer; a first metal layer disposed on a side of the first insulating layer away from the display component layer; a second insulating layer disposed on a side of the first metal layer away from the first insulating layer; and a second metal layer disposed on a side of the second insulating layer away from the first metal layer. The bonding structure includes: at least one first pin disposed on a side of the first metal layer close to the display component layer; and at least one second pin disposed on the side of the display component layer away from the substrate.

In an embodiment of the present application, the display panel further includes a cover plate layer disposed on a side of the touch-control layer away from the encapsulation layer.

In an embodiment of the present application, the encapsulation layer includes: a first encapsulation layer and a second encapsulation layer disposed on the side of the display component layer away from the substrate. The first encapsulation layer and the second encapsulation layer are sequentially arranged in a direction from the center of the substrate to an edge of the substrate. The second encapsulation layer is disposed around the touch-control layer.

In an embodiment of the present application, the second encapsulation layer is in contact with a surface of the cover plate layer close to a display component layer.

In an embodiment of the present application, the through hole is disposed in the first encapsulation layer.

In an embodiment of the present application, a through hole is disposed between the first encapsulation layer and the second encapsulation layer.

As a second aspect of the present application, an embodiment of the present application provides a display device, including a display panel according to above-mentioned embodiments of the first aspect of the present application; a chip assembly including a display driving chip and a touch-control chip; and a circuit board. An end of the circuit board is bonded with the display panel, and the chip assembly is bonded with the circuit board.

According to the display panel provided in the embodiment of the present application, a touch-control chip and a display driving chip are integrated into one chip assembly, and a position of the touch-control layer contacted with the display screen body and an encapsulation area of the display screen body are overlapped. Therefore, a thickness of the display panel can be reduced, and a width of a frame of the display screen body can be greatly reduced. That is, both small thickness and narrow frame can be implemented at the same time.

DETAILED DESCRIPTION

There is a technical problem that a touch-control display screen cannot achieve small thickness, simple process, narrow frame and even full screen at the same time. A touch-control screen mainly adopts an external touch-control module. The external touch-control module not only increases a thickness of a display screen, but also increases a process difficulty of the display screen, and thus a touch-control chip and a display driving chip are integrated into one chip assembly, in this way, although the thickness and the process difficulty of the entire display screen may be reduced, a problem of a wide frame of the display screen may also be caused.

For the above reason, the present application provides a display panel. By integrating a touch-control chip and a display driving chip into one chip assembly, and overlapping a position of a touch-control layer contacted with a display screen body and an encapsulation area of the display screen body, a width of a frame of the display screen body is greatly reduced.

Specifically, the display panel provided by the present application includes a substrate; a display component layer disposed on a side of the substrate; an encapsulation layer disposed on a side of the display component layer away from the substrate; and a touch-control layer disposed on a side of the encapsulation layer away from the display component layer, wherein the display component layer and the touch-control layer are bonded by a bonding structure. The encapsulation layer includes a through hole, and the bonding structure is disposed in the through hole.

The following clearly describes technical solutions in embodiments of the present application with reference to accompanying drawings in the embodiments of the present application. Apparently, the described embodiments are merely some but not all of the embodiments of the present application. Based on the embodiments of the present application, all other embodiments obtained by those skilled in the art without creative efforts fall within the protection scope of the present application.

Figure 1:
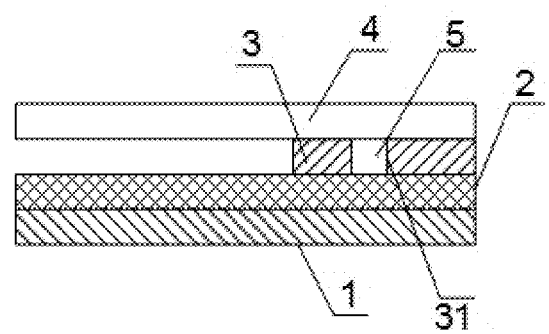
FIG. 1 is a schematic structural diagram of a display panel according to an embodiment of the present application.

FIG. 1 is a schematic structural diagram of a display panel according to an embodiment of the present application. As shown in FIG. 1, the display panel includes a substrate 1, a display component layer 2 disposed on a side of the substrate 1, an encapsulation layer 3 disposed on a side of the display component layer 2 away from the substrate 1, and a touch-control layer 4 disposed on a side of the encapsulation layer 3 away from the display component layer 2. The display component layer 2 and the touch-control layer 4 are bonded by a bonding structure 5. The encapsulation layer 3 includes a through hole 31, and the bonding structure 5 is disposed in the through hole 31. According to the display panel provided in the embodiment of the present application, a touch-control chip and a display driving chip are integrated into one chip assembly, and a position of the touch-control layer 4 contacted with a display screen body and an encapsulation area of the display screen body are overlapped. Therefore, a thickness of the display panel can be reduced, and a width of a frame of the display screen body can be greatly reduced. That is, both small thickness and narrow frame can be implemented at the same time.

The touch-control layer 4 is electrically connected with the display component layer 2 by using the bonding structure 5 in the through hole 31. The display component layer 2 is connected with an integrated chip assembly by using a circuit board, thereby implementing display control and touch control. The bonding structure 5 is disposed in the through hole 31 of the encapsulation layer 3, so that there is no need to reserve a bonding space at an edge of the display screen body, thereby reducing the width of the frame of the display screen body.

The display component layer 2 is a multi-layer structure and includes an anode layer, a light emitting layer, and a cathode layer are sequentially stacked along a light emitting direction. The light emitting layer includes a plurality of sub-pixels for displaying and emitting light, and two adjacent sub-pixels are separated from each other by a pixel interval region (the pixel interval region means a pixel definition layer). The display component layer 2 is divided into a display area and a non-display area surrounding the display area, and all sub-pixels are disposed in the display area. The encapsulation area refers to an area encapsulating the whole display area of the display screen body. Therefore, the position of the touch-control layer 4 contacted with the display screen body and the encapsulation area of the display screen body are overlapped, thereby indicating that a projection of the touch-control layer 4 on the substrate 1 covers a projection of the display area on the substrate 1. The substrate 1, the touch-control layer 4 and the encapsulation layer 3 cooperate with each other, so that the display area of the display component layer 2 is completely sealed to prevent water and oxygen from intruding into the sub-pixels arranged in the display area. The touch-control layer 4 not only has a touch-control function, but also prevents water and oxygen from entering the display area from a cover plate by cooperating with the encapsulation layer 3 when the touch-control layer 4 acts as a part of an encapsulation structure. Therefore, compared with an encapsulation structure and a touch-control structure in a display panel in the related art, the thickness of the display panel in the present application is reduced. Thus, both the small thickness and the narrow frame are implemented at the same time.

A specific structure of each sub-pixel may include, for example, a hole injection layer (HIL), a hole transport layer (HTL), an organic material light emitting layer (EML), an electron transport layer (ETL), and an electron injection layer (EIL) stacked in sequence. An active electron in the cathode layer and a hole generated from the anode layer are combined in the light emitting layer to excite an organic material in the organic material light emitting layer to emit light.

Figure 2:
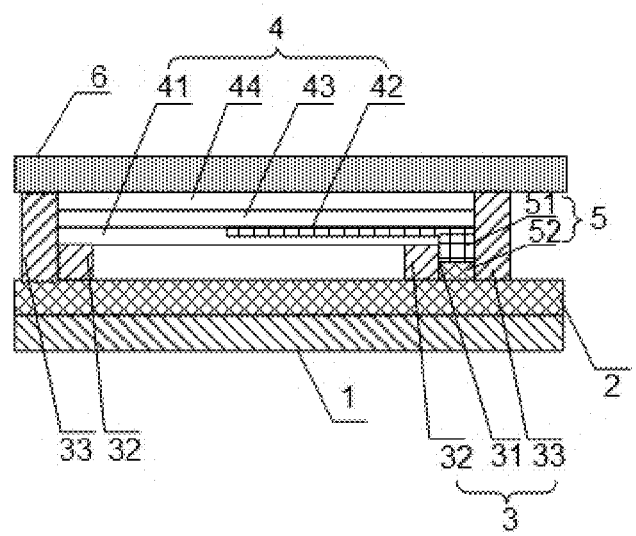
FIG. 2 is a schematic structural diagram of a display panel according to another embodiment of the present application.

In an embodiment of the present application, as shown in FIG. 2, an encapsulation layer 3 includes a first encapsulation layer 32 and a second encapsulation layer 33 which are sequentially arranged in a direction from the center of a substrate 1 to an edge of the substrate 1. The first encapsulation layer 32 is disposed on a surface of a display component layer 2 away from the substrate 1. The second encapsulation layer 33 is also disposed on the surface of the display component layer 2 away from the substrate 1, and the second encapsulation layer 33 is disposed around a touch-control layer 4. The first encapsulation layer 32 includes a through hole 31, the through hole 31 is disposed in the first encapsulation layer 32. A bonding structure 5 is disposed in the through hole 31. The encapsulation layer 3 in the embodiment of the present application includes the second encapsulation layer 33, and the second encapsulation layer 33 is disposed around the touch-control layer 4. The second encapsulation layer 33 disposed around the touch-control layer 4 can prevent water and oxygen in an outside environment from intruding into the touch-control layer 4, thus reducing a probability of an electrode in the touch-control layer 4 being eroded by water and oxygen, thereby reducing a probability of the electrode in the touch-control layer 4 being damaged, and improving service life of the display panel. As for the display panel in FIG. 2, the first encapsulation layer 32 is in contact with both the display component layer 2 and the touch-control layer 4, the first encapsulation layer 32 includes the through hole 31, the bonding structure 5 is disposed in the through hole 31, and the bonding structure 5 is electrically connected with the display component layer 2 and the touch-control layer 4. The second encapsulation layer 33 is in contact with the display component layer 2, a cover plate 6, and a side surface of the touch-control layer 4. The touch-control layer 4 may prevent water and oxygen from entering a display area in a direction from the cover plate 6 to the display area, and the encapsulation layer 3 may prevent water and oxygen from entering the display area in a direction from a non-display area to the display area, so that water and oxygen around the display area cannot intrude into the display area. Meanwhile, the encapsulation layer 3 is disposed around the touch-control layer 4, thereby reducing a probability of an electrode in the touch-control layer 4 being eroded by water and oxygen.

As shown in FIG. 2, the touch-control layer 4 includes: a first insulating layer 41 disposed on a side of the first encapsulation layer 32 away from the display component layer 2; a first metal layer 42 disposed on a side of the first insulating layer 41 away from the display component layer 2; a second insulating layer 43 disposed on a side of the first metal layer 42 away from the first insulating layer 41; and a second metal layer 44 disposed on a side of the second insulating layer 43 away from the first metal layer 42. The bonding structure 5 includes: a first pin 51 disposed on a side of the first metal layer 42 close to the display component layer 2; and a second pin 52 disposed on the side of the display component layer 2 away from the substrate 1. The first pin 51 is electrically connected with the second pin 52, so that the touch-control layer 4 is electrically connected with the display component layer 2. The display component layer 2 is electrically connected with a chip assembly, the display control and the touch control are realized.

In a further embodiment, the first pin 51 may be manufactured integrally with the first metal layer 42. A process of manufacturing integrally may save process steps and improve reliability of electrical connection.

According to the display panel provided in the embodiment of the present application, a touch-control chip and a display driving chip are integrated into one chip assembly, and a position of the touch-control layer 4 contacted with the display screen body and an encapsulation area of the display screen body are overlapped, so that a thickness of the display panel can be reduced, and a width of a frame of the display screen body is also greatly reduced. That is, both small thickness and narrow frame can be implemented at the same time.

In a further embodiment of the present application, an encapsulation layer 3 includes a through hole 31, that is, the through hole 31 is disposed in the encapsulation layer 3. In addition, the encapsulation layer 3 includes a first encapsulation layer 32 and a second encapsulation layer 33, the through hole 31 is disposed between the first encapsulation layer 32 and the second encapsulation layer 33. A bonding structure 5 is disposed in the through hole 31. That is, a gap is disposed between the first encapsulation layer 32 and the second encapsulation layer 33, and the gap acts as the through hole 31. The bonding structure 5 is disposed between the first encapsulation layer 32 and the second encapsulation layer 33. Therefore, in a process of manufacturing a display panel, the first encapsulation layer 32 and the second encapsulation layer 33 are directly and separately deposited, the gap between the first encapsulation layer 32 and the second encapsulation layer 33 can be formed, thereby reducing process complexity.

In an embodiment of the present application, as shown in FIG. 2, a display panel further includes a cover plate layer 6 disposed on a side of a touch-control layer 4 away from an encapsulation layer 3.

In a further embodiment of the present application, an encapsulation layer 3 includes a first encapsulation layer 32 and a second encapsulation layer 33. The first encapsulation layer 32 is disposed on a surface of a display component layer 2 away from a substrate 1. The second encapsulation layer 33 is also disposed on the surface of the display component layer 2 away from the substrate 1, and the second encapsulation layer 33 is disposed around a touch-control layer 4, as well as the second encapsulation layer 33 is in contact with a surface of a cover plate layer 6 close to the touch-control layer 4. Since in the embodiment of the present application, the second encapsulation layer 33 is in contact with the surface of the cover plate layer 6 close to the touch-control layer 4, water and oxygen in an outside environment may be better prevented from intruding into the touch-control layer 4, thereby reducing a probability that an electrode in the touch-control layer 4 is damaged.

In an embodiment, as shown in FIG. 2, a difference between a thickness of the second encapsulation layer 33 and a thickness of the first encapsulation layer 32 is greater than or equal to a thickness of the touch-control layer 4. By setting the difference in thickness, the first encapsulation layer 32, the second encapsulation layer 33 and the touch-control layer 4 are tightly bonded to reduce gaps, thereby reducing a probability of water and oxygen intruding into a display area.

Figure 3:
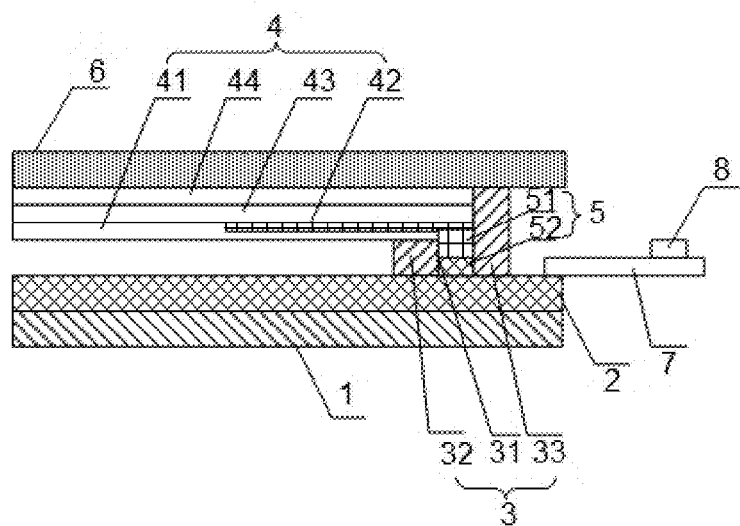
FIG. 3 is a schematic structural diagram of a display panel according to yet another embodiment of the present application.

FIG. 3 is a schematic structural diagram of a display device according to yet another embodiment of the present application. As shown in FIG. 3, the display device includes a display panel; a chip assembly 8 integrated with a display driving chip and a touch-control chip; and a circuit board 7. An end of the circuit board 7 is bonded with the display panel, and the chip assembly 8 is bonded with the circuit board 7. A structure of the display panel is the structure of the display panel described above. According to the display device provided in the embodiment of the present application, the display driving chip and the touch-control chip are integrated into one chip assembly, and a position of a touch-control layer 4 contacted with a display screen body and an encapsulation area of the display screen body are overlapped. Therefore, a thickness of the entire display panel is reduced, and a width of a frame of the display screen body is also greatly reduced at the same time.

Figure 4:
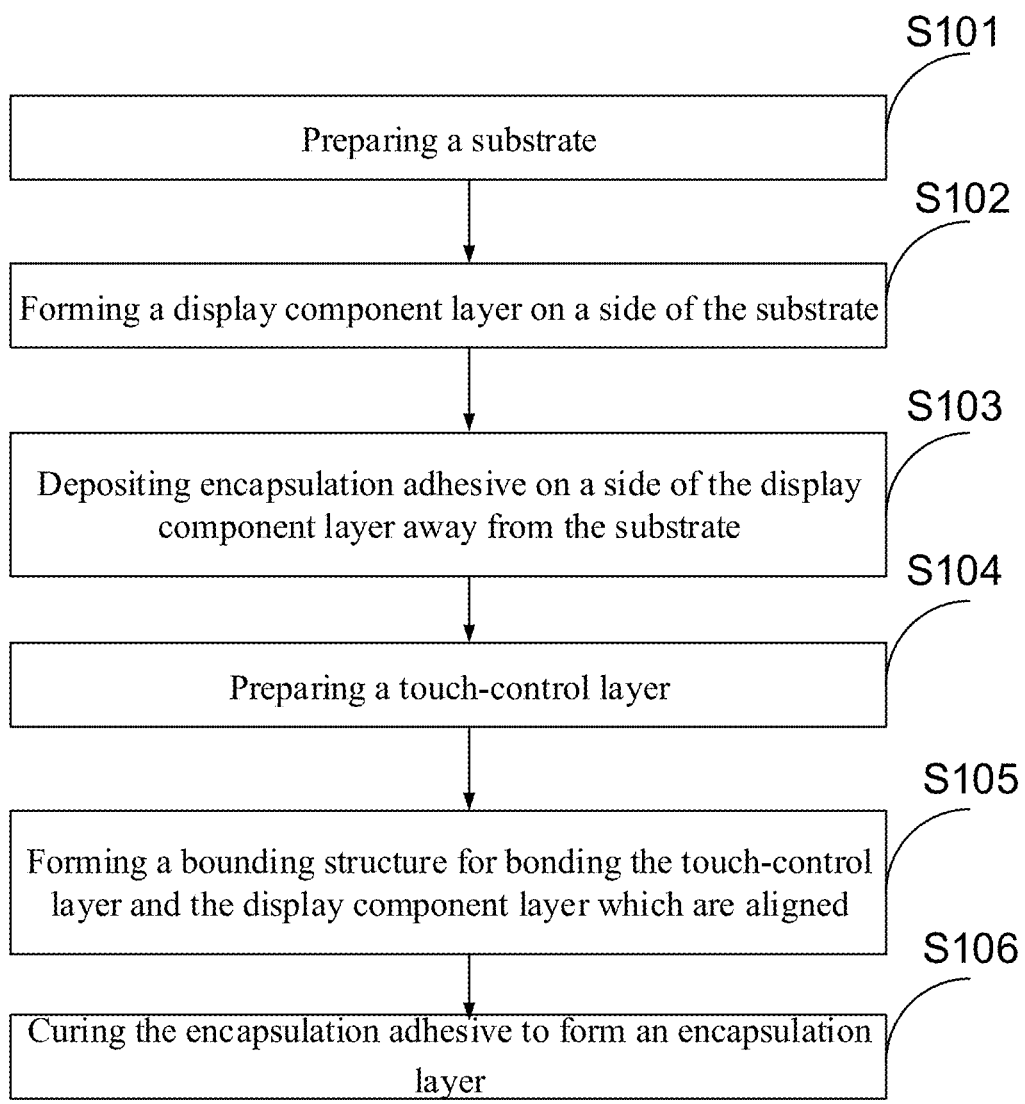
FIG. 4 is a schematic flowchart of a method for manufacturing a display panel according to an embodiment of the present application.

FIG. 4 shows a method for manufacturing a display panel according to an embodiment of the present application. As shown in FIG. 4, the method for manufacturing the display panel includes the following steps.

Step S101: preparing a substrate.

Step S102: forming a display component layer on a side of the substrate.

Step S103: depositing encapsulation adhesive on a side of the display component layer away from the substrate, wherein a gap is disposed between two adjacent portions of the encapsulation adhesive after the encapsulation adhesive is deposited.

Step S104: preparing a touch-control layer.

Step S105: forming a bounding structure for bonding the touch-control layer and the display component layer which are aligned, the bonding structure is disposed in the gap between two adjacent portions of the encapsulation adhesive.

Step S106: curing the encapsulation adhesive to form an encapsulation layer.

According to the display panel manufactured in the embodiment of the present application, a touch-control chip and a display driving chip are integrated into one chip assembly, and a position of the touch-control layer contacted with a display screen body and an encapsulation area of the display screen body are overlapped. Therefore, a thickness of the entire display panel is reduced, and a width of a frame of the display screen body is also greatly reduced.

In an embodiment of the present application, in step S105, the touch-control layer and the display component layer which are aligned are bonded by using ultrasonic wave. In the embodiment of the present application, the touch-control layer and the display component layer which are aligned are bonded by using a technology of ultrasonic wave, thereby avoiding an impact on an encapsulation layer when other bonding technologies are used.

The foregoing descriptions are merely some embodiments of the present application, but are not intended to limit the present application. Any modification, equivalent replacement, or improvement made without departing from the spirit and principle of the present application shall fall within the protection scope of the present application.

What is claimed is:

1. A display panel, comprising:
   a substrate;
   a display component layer disposed on a side of the substrate;
   an encapsulation layer disposed on a side of the display component layer away from the substrate; and
   a touch-control layer disposed on a side of the encapsulation layer away from the display component layer, wherein the display component layer and the touch-control layer are bonded by a bonding structure, the encapsulation layer comprises a through hole, and the bonding structure is disposed through the hole;
   wherein a display area of the display component layer is completely sealed and encapsulated by the touch-control layer and the encapsulation layer.

2. The display panel according to claim 1, wherein the touch-control layer comprises:
   a first insulating layer disposed on the side of the encapsulation layer away from the display component layer;
   a first metal layer disposed on a side of the first insulating layer away from the display component layer;
   a second insulating layer disposed on a side of the first metal layer away from the first insulating layer; and
   a second metal layer disposed on a side of the second insulating layer away from the first metal layer,
   wherein the bonding structure comprises:
   at least one first pin disposed on a side, facing the display component layer, of the first metal layer; and
   at least one second pin disposed on the side of the display component layer away from the substrate.

3. The display panel according to claim 1, further comprising:
   a cover plate layer disposed on a side of the touch-control layer away from the encapsulation layer.

4. The display panel according to claim 3, wherein the encapsulation layer comprises:
   a first encapsulation layer and a second encapsulation layer disposed on the side of the display component layer away from the substrate, wherein the first encapsulation layer and the second encapsulation layer are sequentially arranged in a direction from a center of the substrate to an edge of the substrate,
   wherein the second encapsulation layer is disposed around the touch-control layer.

5. The display panel according to claim 4, wherein the second encapsulation layer is in contact with a surface, facing to the display component layer, of the cover plate layer.

6. The display panel according to claim 5, wherein the through hole comprises a gap disposed between the first encapsulation layer and the second encapsulation layer.

7. The display panel according to claim 5, wherein the first encapsulation layer is in contact with both the display component layer and the touch-control layer, and the first insulating layer is disposed on a side, away from the display component layer, of the first encapsulation layer to prevent water and oxygen from entering the display area in a direction from the cover plate layer to the display area.

8. The display panel according to claim 4, wherein the through hole is disposed in the first encapsulation layer.

9. The display panel according to claim 4, wherein the through hole is disposed between the first encapsulation layer and the second encapsulation layer.

10. The display panel according to claim 9, wherein a difference between a thickness of the second encapsulation layer and a thickness of the first encapsulation layer is greater than or equal to a thickness of the touch-control layer.

11. The display panel according to claim 2, wherein the at least one first pin is integral manufactured integrally with the first metal layer.

12. The display panel according to claim 1, wherein the touch-control layer contacts the display component layer and overlaps an encapsulation area of the display component layer, and a projection of the touch-control layer on the substrate covers a projection of the display area on the substrate.

13. A display device, comprising:
   a display panel according to claim 1;
   a chip assembly comprising a display driving chip and a touch-control chip; and
   a circuit board, wherein
   an end of the circuit board is bonded with the display panel, and the chip assembly is bonded with the circuit board.

14. A method for manufacturing a display panel, comprising:
   preparing a substrate;
   forming a display component layer on a side of the substrate;
   depositing encapsulation adhesive on a side, away from the substrate, of the display component layer, wherein the encapsulation adhesive is deposited as two adjacent portions having a gap disposed therebetween;
   preparing a touch-control layer;
   forming a bonding structure for bonding the touch-control layer and the display component layer which are aligned, wherein the bonding structure is disposed in the gap between the two adjacent portions of the encapsulation adhesive, wherein a display area of the display component layer is completely sealed and encapsulated by the touch-control layer and the encapsulation layer; and
   curing the encapsulation adhesive to form an encapsulation layer, wherein the touch-control layer and the encapsulation layer cooperate with each other, so that a display area of the display component layer is completely sealed.

15. The method for manufacturing a display panel according to claim 14, wherein a position of the touch-control layer contacted with the display component layer and an encapsulation area of the display component layer are overlapped, and a projection of the touch-control layer on the substrate covers a projection of the display area on the substrate.

16. The method for manufacturing a display panel according to claim 14, wherein the touch-control layer comprises:
   a first insulating layer disposed on the side of the encapsulation layer away from the display component layer;
   a first metal layer disposed on a side of the first insulating layer away from the display component layer;
   a second insulating layer disposed on a side of the first metal layer away from the first insulating layer; and
   a second metal layer disposed on a side of the second insulating layer away from the first metal layer,
      wherein the bonding structure comprises:
         at least one first pin disposed on a side, close to the display component layer, of the first metal layer; and
         at least one second pin disposed on the side of the display component layer away from the substrate.

17. The method for manufacturing a display panel according to claim 16, wherein the encapsulation layer comprises:
   a first encapsulation layer and a second encapsulation layer disposed on the side of the display component layer away from the substrate, wherein the first encapsulation layer and the second encapsulation layer are sequentially arranged in a direction from a center of the substrate to an edge of the substrate, and the second encapsulation layer is disposed around the touch-control layer.

18. The method for manufacturing a display panel according to claim 17, wherein the first encapsulation layer is in contact with both the display component layer and the touch-control layer, and the first insulating layer is disposed on a side, away from the display component layer, of the first encapsulation layer to prevent water and oxygen from entering the display area in a direction from the cover plate layer to the display area.

19. The method for manufacturing a display panel according to claim 18, wherein a difference between a thickness of the second encapsulation layer and a thickness of the first encapsulation layer is greater than or equal to a thickness of the touch-control layer.

20. The method for manufacturing a display panel according to claim 17, wherein the second encapsulation layer is in contact with a surface, close to the display component layer, of the cover plate layer.

\* \* \* \* \*